United States Patent [19]

Kim et al.

[11] Patent Number: 4,929,853
[45] Date of Patent: May 29, 1990

[54] INPUT TRANSLATING CIRCUIT FOR CMOS DEVICE

[75] Inventors: Byeng-yun Kim, Seoul; Yong-bo Park, Busan, both of Rep. of Korea

[73] Assignee: Samsung Electronics, Co., Ltd., Kyunggi, Rep. of Korea

[21] Appl. No.: 342,923

[22] Filed: Apr. 25, 1989

[30] Foreign Application Priority Data

Jul. 19, 1988 [KR] Rep. of Korea .................. 88-9009

[51] Int. Cl.$^5$ .................. H03K 19/094; G06F 7/38
[52] U.S. Cl. .................. 307/475; 307/451; 307/469; 307/264; 307/290; 307/279
[58] Field of Search .............. 307/443, 448, 451, 465, 307/468-469, 475, 264, 290, 279

[56] References Cited

FOREIGN PATENT DOCUMENTS 0215134 12/1983 Japan .................. 307/279

Primary Examiner—Stanley D. Miller
Assistant Examiner—Margaret Rose Wambach
Attorney, Agent, or Firm—Cushman, Darby & Cushman

[57] ABSTRACT

An input translating circuit for a CMOS device is disclosed which can be operated without being influenced by a level of the supply voltage. This is made possible by providing a supply voltage level discriminating means consisting of a voltage dividing network for dividing the supply voltage into predetermined voltages and a level comparing means for comparing the divided voltage with the reference voltage level, and further by providing a constant voltage supply means, so that a trip voltage, used in the operation of the circuit, can be maintained at a constant level regardless of the variations of the supply voltage. Further, the circuit according to the present invention eliminates corresponding mask work requirements for the option of the power voltage in the manufacturing process, thereby lowering production complexity costs.

6 Claims, 3 Drawing Sheets

INPUT TRANSLATING CIRCUIT FOR CMOS DEVICE

FIELD OF THE INVENTION

The present invention relates to an input translating circuit for a CMOS device, and particularly to a circuit for translating TTL input signals to CMOS logic levels available in a CMOS device in which the trip voltage of the CMOS inverter located at the input terminal of a CMOS device can be maintained at a constant level, regardless of the variation of the level of the power voltage supplied to the CMOS device.

BACKGROUND OF THE INVENTION

Recently, as a part of the development of a submicron scale semiconductor device which has appeared as a result of the rapid progress of the semiconductor technology a trend is seen in the art where the supply voltage for a CMOS device is stepped down from 5V to 3.3V to assure the proper operation of such a submicron scale semiconductor device. Accordingly, it is frequently seen that the structure of the semiconductor chip is designed such that it can provide the alternative of 5V or 3V for the power source.

A conventional circuit is illustrated in FIG. 1 wherein two sources of power can be alternatively used by translating the TTL level signal applied to the input terminal of the semiconductor chip to a CMOS logic level.

As will be discussed in detail hereinbelow, the conventional circuit (FIG. 1) includes at least one CMOS inverting means having a p-channel MOS transistor and a n-channel transistor connected in series and receiving an external input signal of the TTL levels. The circuit also includes at least one p-channel MOS transistor for receiving enable signals into the gate thereof so as to allow the CMOS inverting means to have a tri-state condition in response to the enable signals. Furthermore, as specifically shown in the identical drawing in conformity with a customer's requirement an additional p-channel MOS transistor is connected in parallel to the p-channel MOS transistor within the CMOS inverting means so that two different power sources may be alternatively utilized.

The additional p-channel MOS transistor includes a gate for optionally receiving the power voltage or the external input signals of the TTL levels by means of optional linkages, the linkage state of which could be permanently realized only through utilization a special mask work in the semiconductor manufacturing process. Therefore, the above physical linkage must not be changed over and force the overall CMOS integrated circuit containing the said input translating circuit to be capable of operating under a only single selected power voltage.

Furthermore, such a conventional scheme raises the costs of manufacture.

SUMMARY OF THE INVENTION

Therefore, the present invention is intended to overcome the aforementioned disadvantages of the prior art, and it is an object of the present invention to provide a new input translating circuit which allows the on-chip, CMOS integrated circuits to be operative independently from the variation of the supply voltage by providing a means for making the $\beta$(gain factor) ratio of at least one CMOS inverting means vary automatically in correspondence with the level of a supply voltage.

It is another object of the present invention to provide a supply voltage level discrimination means which can be operated without being affected by the variation of the supply voltage, and which can be manufactured in a single IC chip together with a CMOS input translating circuit.

It is still another object of the present invention to provide a circuit which simplifies the manufacturing process thereof and thus lowers corresponding costs by eliminating mask work requirement related to the conventional methods.

In achieving these objects of the invention, a circuit of one embodiment of the present invention includes a first p-channel MOS transistor for receiving inverted enable signals ENB to its gate;

a first CMOS inverting means consisting of a second p-channel MOS transistor having a source for receiving the supply voltage through the first p-channel MOS transistor, and a first n-channel MOS transistor having a source grounded; the external input signals of a TTL level being applied to the connection node of the gates of the second p-channel and first n-channel MOS transistors; the connection node of the drains of the transistors acting as an output terminal of the first CMOS inverting means;

a second CMOS inverting means consisting of a third p-channel MOS transistor having a source for receiving the supply voltage, and a second n-channel MOS transistor with its source grounded, the output terminal of the first CMOS inverting means being connected to the connection node of the gates of the third p-channel and second n-channel MOS transistors and the connection node of the drains of said transistors serving as an output terminal;

a third n-channel MOS transistor in which the inverted enable signals are applied to its gate, its drain is connected to the connection node of the two gates of the second CMOS inverting means, and its source is grounded;

a fourth p-channel MOS transistor having a drain and a source for being connected respectively to the drain and source of the second p-channel MOS transistor of the first CMOS inverting means; and a supply voltage level discrimination means consisting of a voltage dividing means for producing a predetermined voltage after division of a supply voltage; and a level comparing means for comparing the predetermined voltage produced from the supply voltage level discrimination means with the reference voltage to produce a control voltage Vx for the fourth p-channel MOS transistor, the supply voltage level discrimination means turning on or off said fourth p-channel MOS transistor in correspondence with the level of the supply voltage, wherein the geometrical aspect ratio $(W/L)_1$ of the first p-channel MOS transistor is made sufficiently larger than the geometrical aspect ratios $(W/L)_2$ and $(W/L)_4$ of the two parallelly connected second and fourth p-channel MOS transistors.

Further, an example of the level comparing means within the supply voltage level discriminating means of the present invention includes:

a first n-channel MOS transistor for being turned off if the divided voltage is below the threshold voltage thereof for said reference voltage, and turned on if over said threshold voltage;

a first p-channel MOS transistor in which the supply voltage is applied to its source, the enable signals are applied to its gate, and its drain is connected to the drain of the first n-channel MOS transistor;

a second n-channel MOS transistor which is turned off if the output signal emitted from the drain of the first n-channel MOS transistor to be applied to the gate thereof is below the threshold voltage of the second n-channel MOS transistor, and turned on if over the threshold voltage thereof;

a second p-channel MOS transistor in which the supply voltage is applied to its source, the enable signals are applied to its gate, and its drain is connected to the drain of the second n-channel MOS transistor; and a third n-channel MOS transistor in which the enable signals are applied to its gate, its drain is commonly connected to the sources of the first and second n-channel MOS transistors, and its source is grounded, wherein the output of the drain of the second n-channel MOS transistor is applied to the gate of the fourth p-channel MOS transistor which is connected is parallel with the second p-channel MOS transistor in the first CMOS inverting means.

Furthermore, a constant voltage supply means is further provided for applying a constant gate voltage under the enable condition to the gates of the first and second p-channel MOS transistors in the level comparing means of the supply voltage level discrimination means so that the current at the drains of the first and second transistors are maintained at a constant level regardless of the variations of the level of the enable signals.

The constant voltage supplying means includes a fourth n-channel MOS transistor in which the enable signals are applied to its gate, and its source is grounded, and a third p-channel MOS transistor in which the supply voltage is applied to its source, its drain is connected to the drain of the n-channel MOS transistor, and its gate is connected to its own drain; the connection node of the drains of the fourth n-channel and third p-channel MOS transistors is connected to the respective gates of the first and second p-channel MOS transistors of the level comparing means.

Further, according to a modified feature provided by the present invention, the drain and source of the third p-channel MOS transistor are respectively connected to the drain and source of the first p-channel MOS transistor in which inverted enable signals are applied to its gate, while the geometrical size of the second p-channel MOS transistor is sufficiently larger than the geometrical sizes of the first p-channel MOS transistor and the fourth p-channel MOS transistor parallelly connected as described above, thereby making it possible to carry out the same function.

BRIEF DESCRIPTION OF THE DRAWINGS

The above objects and other advantages of the present invention will become more apparent by describing the preferred embodiments of the present invention in detail with reference to the attached drawings wherein.

DESCRIPTION OF THE PREFERRED EMBODIMENTS

Figure 1:
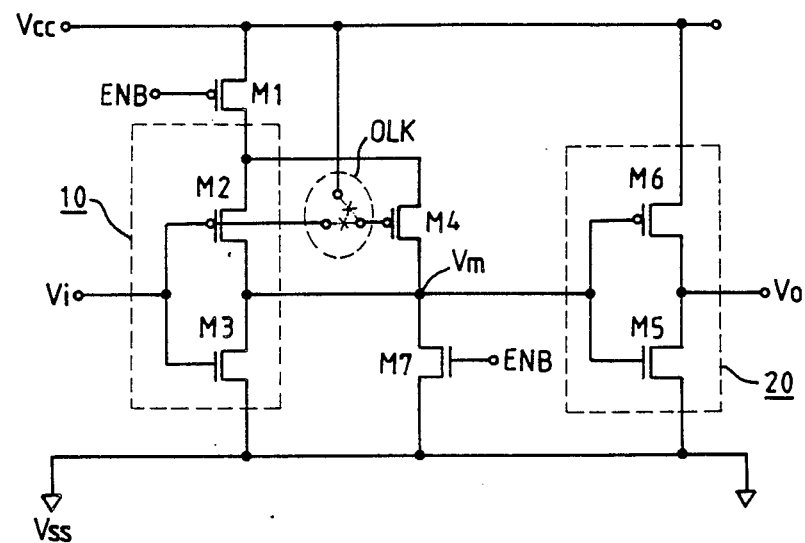
FIG. 1 is a diagrammatic illustration of an input translating circuit for CMOS device according to the conventional device.

Referring now to FIG. 1, the conventional input translating circuit, the disclosure of which is incorporated herein by reference, includes a p-channel transistor M1 for receiving inverted enable signals at its gate and allowing first inverting means 10 connected thereto to have a tri-state condition in response to the inverted enable signals ENB; a first CMOS inverting means 10 consisting of a p-channel MOS transistor M2 receiving the supply voltage Vcc into its source through the p-channel MOS transistor M1, and an n-channel MOS transistor M3 with its source grounded, said p-channel and n-channel MOS transistors M2 and M3 receiving into their common connection node of their gates the external input signals of the TTL levels, and their drains being commonly connected to constitute the output of the first CMOS inverting means 10; a second CMOS inverting means 20 consisting of a p-channel MOS transistor M6 receiving the supply voltage into its source, and an n-channel MOS transistor M5 with its source grounded, the connection node formed of the gates of said p-channel and n-channel MOS transistors M6 and M5 being connected to the connection node formed of the drains of said first CMOS inverting means 10; these commonly connected drains becoming the output terminal; and an n-channel MOS transistor M7 receiving into its gate the inverted enable signals, its drain being connected to the connection node of the gates of said second CMOS inverting means 20, and its source being grounded.

Further, a p-channel MOS transistor M4 is provided in such a manner that its drain and source are respectively connected to the drain and source of the p-channel MOS transistor M2 within the first CMOS inverting means 10. The p-channel MOS transistor M4 is manufactured through a known masking process in such a manner that the supply voltage Vcc or external input signals Vi can be alternatively applied to its gate by optional linkages OLK drawn in phantom in FIG. 1. In other words, the linkage state in the optional linkages with respect to the gate of the p-channel MOS transistor M4 would be realized in a so-called masking work in conformity with a customer's requirements: if it is desired that the CMOS integrated circuit be used with a supply voltage of 5V, a masking process is used so that the gate of the p-channel MOS transistor M4 could receive a gate voltage of 5V, thereby keeping the p-channel MOS transistor M4 turned off permanently. On the other hand, if a supply voltage of 3.3V is to be used, a masking process is used in such a manner that external input signals Vi as the gate voltage can be supplied, thereby making the p-channel MOS transistor M4 should be turned on/off for a TTL level "0" or "1" of the external input signals Vi together with the p-channel transistor M2 at the same time.

Therefore, the $\beta$ ratio of the first CMOS inverting means 10 under the supply voltage of 5V is represented by $$\beta r\,(Vcc = 5\text{ V}) = \frac{\beta n3}{\beta p2}$$

where $\beta p2$ represents the gain factor of the p-channel transistor M2, and $\beta n3$ the gain factor of the n-channel transistor M3. While, under Vcc=3.3V, it will be given by $$\beta r(Vcc = 3.3\text{ V}) = \frac{\beta n3}{\beta p2 + \beta p4}$$

where $\beta p4$ represents the gain factor of the p-channel transistor M4.

Therefore, if the level of the supply voltage is lowered, then the $\beta$ ratio is also lowered, while, if the level of the supply voltage is raised, the $\beta$ ratio is also raised. Further, the trip voltage of the first CMOS inverting means 10 can be defined as follows:

$$V\,tr\,(Vi = Vm) = 1 + \frac{Vcc + K}{1 + \sqrt{\beta r}}$$

where Vcc indicates the supply voltaqe, K a constant, and $\beta r$ the $\beta$ ratio. Therefore, the trip voltage can be maintained at a certain level regardless of the variation of the supply voltage.

Here, the geometrical size of the p-channel MOS transistor M1 connected to the first CMOS inverting means 10 is much larger than those of p-channel MOS transistors M2 and M4.

However, the above conventional scheme reveals the disadvantage that a masking process for the option of the supply voltage is separately executed outside the general production line of the CMOS integrated circuits, which causes the costs to rise. Further, there is another disadvantage that, once the option has been completed by carrying out the masking process, the resultant device is restricted to single power voltage.

Figure 2:
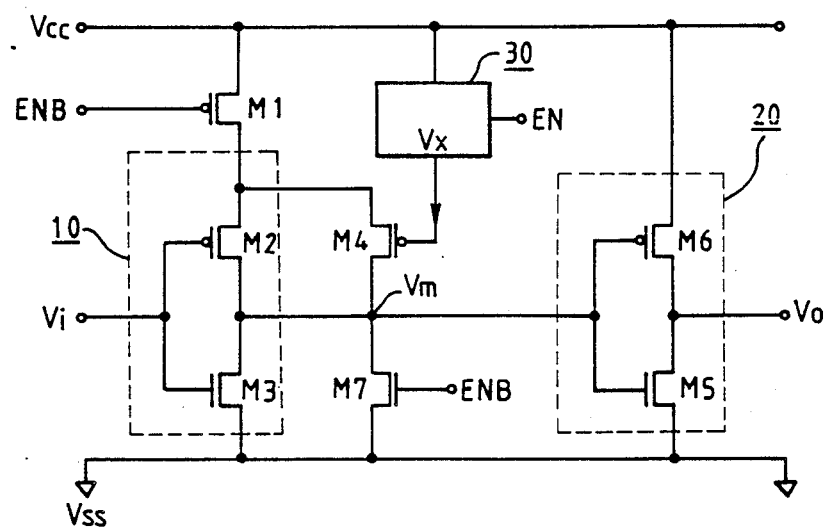
FIG. 2 is a diagrammatic illustration of an input translating circuit for a CMOS device according to the present invention.

FIG. 2 illustrates the input translating circuit for a CMOS device according to an aspect of the present invention. The input translating circuit according to the present invention includes a first CMOS inverting means 10 for inverting the external input signals Vi of a TTL level into a CMOS logic level; a second CMOS inverting means 20 for re-inverting the output of the first CMOS inverting means 10 to supply its output to the internal circuit of a CMOS integrated circuit; a p-channel MOS transistor M1 for applying the supply voltage to the first CMOS inverting means 10 during the application of the inverted enable signals ENB='0'; an n-channel transistor M7 for sinking into ground the charges existing between the output terminal of the first CMOS inverting means 10 and the input terminal of the second CMOS inverting means 20 during the disable state, e.g. the inverted enable signals ENB='1'; an additional p-channel MOS transistor M4 for being connected in parallel to both the drain and the source of the p-channel MOS transistor M2 of the first CMOS inverting means 10 for varying the $\beta$ ratio of the CMOS inverting means 10 in correspondence with the levels of the supply voltage; and a supply voltage level discrimination means 30 for generating the control voltage Vx to turn off the additional p-channel MOS transistor M4 at the supply voltage of 5V and by turn on the same at the supply voltage of 3.3V.

In the circuit set forth above, the geometrical aspect ratio $(W/L)_1$ of the p-channel MOS transistor M1 is designed to be sufficiently larger than the geometrical aspect ratios $(W/L)_2$ and $(W/L)_4$ of the first and the second p-channel MOS transistors M2 and M4.

Figure 3:
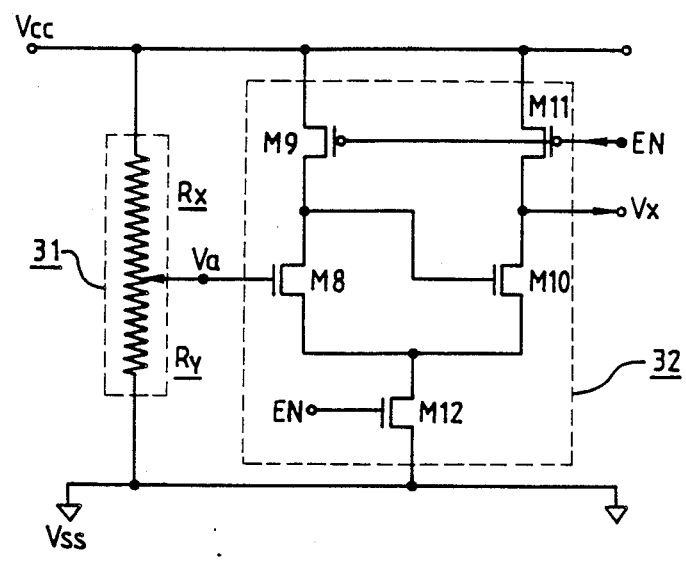
FIG. 3 is a first exemplary view of the circuit of the supply voltage level discrimination means of FIG. 2.

One example of the supply voltage level discrimination means 30 shown in FIG. 3 according to the invention includes a voltage dividing means 31 for dividing the supply voltage into the predetermined voltages and a level comparing means 32 for comparing the divided voltages with the reference voltages.

The voltage dividing means 31 may be located on the same chip IC using a resistance process (a known manufacturing process for the CMOS device). The voltage dividing means 31 includes a resistance Rx and a resistance Ry divided by means of a tab disposed at an intermediate position, thereby supplying to the level comparing means 32 the divided voltages Va, defined by the following formula:

$$Va = \frac{Ry}{Rx + Ry} Vcc$$

The level comparing means 32 includes a first n-channel MOS transistor M8 turned on when the divided voltage Va is higher than the threshold voltage Vtn8 thereof for the reference voltage, and turned off when the former is lower than the latter; a first pchannel MOS transistor M9 driven by the enable signal EN supplied to its gate for supplying a constant drain current to said n-channel MOS transistor M8; a second n-channel MOS transistor M10 having a gate connected to the drain of the said n-channel MOS transistor M8 in order to ensure the drain voltage of said transistor M10 has an inverted drain voltage of the transistor M8; a second p-channel MOS transistor M11 driven by the enable signals EN applied to its gate for supplying a constant drain current to the said n-channel MOS transistor M10; and a third n-channel MOS transistor M12 driven by the enable signals EN applied to its gate, its source being grounded, and its drain being commonly connected to the sources of the said two n-channel MOS transistors M8 and M10 to form current passages to the ground.

In the circuit, the drain terminal of the n-channel MOS transistor M10 serves as the output terminal of the control voltage Vx.

Figure 4:
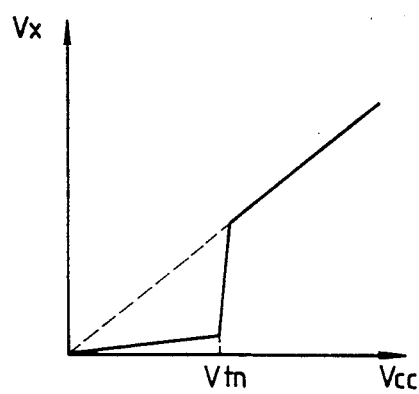
FIG. 4 is a graphical illustration of the input output characteristics of the supply voltage level discrimination means.

The input/output characteristics curve of the level comparing means 32 constituted as described above are as shown in FIG. 4.

Therefore, in the case where 5V and/or 3.3V are made to be supplied as the supply voltage Vcc, if the divided voltages Va are made up as follows:

$$Va\,[Vcc = 5\text{ V}] = \frac{Ry}{Rx + Ry} \times Vcc > Vtn8$$

$$Va\,[Vcc = 3.3\text{ V}] = \frac{Ry}{Rx + Ry} \times Vcc < Vtn8$$

then the output voltages Vx of the level comparing means 32 are as follows:

$$Vx\,[Vcc = 5\text{ V}] = \text{logic ``1''}$$
$$Va\,[Vcc = 3.3\text{ V}] = \text{logic ``0''}$$

That is, the level of the supply voltage is identified in such a manner that Vx becomes a logic "1" at the supply voltage of 5V, and a logic "0" at the supply voltage of 3.3V.

Meanwhile, as the level comparing means 32 receives an enable signal EN at the gates of the two p-channel MOS transistors M9 and M11 which are to supply constant currents, the drain current values might be varied due to the variations of the enable signal voltage in association with the variations of the supply voltage in case the former is dependent on the latter. Accordingly, a slight instability might be introduced into the circuit operations. However, such apprehensions can be overcome by providing an enable signal generator means adapted to be well operative independently of the variations of the supply voltage.

Figure 5:
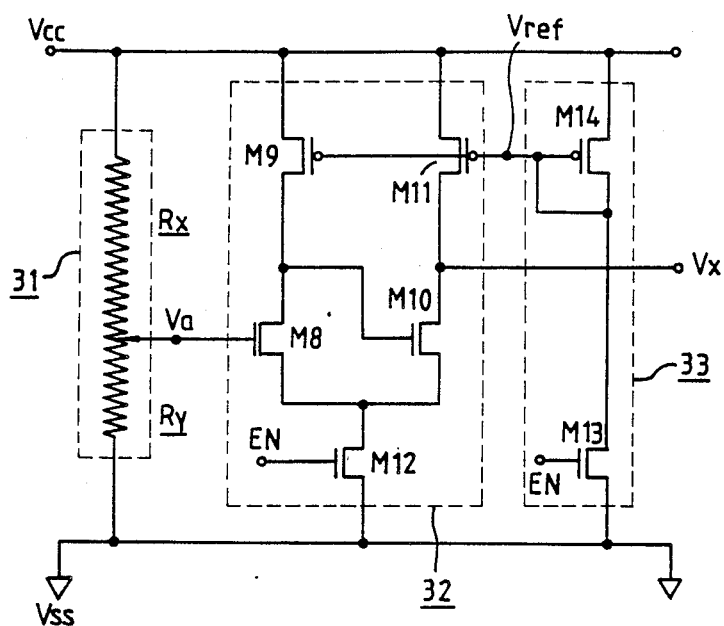
FIG. 5 shows a second exemplary view of the circuit of the supply voltage level discrimination means of FIG. 2.

FIG. 5 illustrates another example of a level discrimination means containing a constant voltage supply means 33 which can endow gates of said p-channel transistors M9 and M11 with a constant voltage in lieu of the enable signal.

In the embodiment of in FIG. 5, a constant voltage supply means 33 is further provided in order to supply constant currents to drains of two p-channel MOS transistors M9 and M11 by maintaining gate voltages thereof at a constant level. The constant voltage supply means 33 consists of an n-channel MOS transistor M13 and a p-channel MOS transistor M14, the former being constituted such that the enable signal EN is applied to its gate and its source is grounded, and the latter being constituted such that the supply voltage Vcc is applied to its source, its drain is connected to the drain of the n-channel MOS transistor M13, and its gate is connected to its own drain. Here, the constant voltage is obtained from a connecting node between the p-channel MOS transistor M14 and the n-channel MOS transistor M13, and the constant voltage will be sustained in an even level regardless of the variations of the enable signal voltage. Therefore, the drains of the two p-channel MOS transistor M9 and M11 which receive the constant voltage to their gates will always have a constant current value.

The circuits of the present invention constituted as described above will now be described as to their operations.

Under the condition in which the enable signals-(EN="1") are applied, if the supply voltage is 5V, then the divided voltage Va obtained by means of the voltage dividing means 31 is defined as follows:

$$Va\ [Vcc = 5\ V] = \frac{Ry}{Rx + Ry} \times 5\ V > Vtn8$$

Therefore, the n-channel MOS transistor M8 is turned on, and, in turn, the n-channel MOS transistor M10 is turned off because the low output voltage of the drain of the n-channel MOS transistor M8 is lower than the threshold voltage Vtn8 of the n-channel MOS transistor M10, with the result that the high output voltage (i.e.Vx= "1") of the drain of the n-channel MOS transistor M10 is applied to the gate of the p-channel MOS transistor M4 to turn off the p-channel transistor M4. Therefore, the $\beta$ ratio of the first CMOS inverting means 10 is defined as follows:

$$\beta r\ (Vcc = 5\ V) = \frac{\beta n3}{\beta p2}$$

where $\beta n3$ represents the gain factor of the n-channel translator M3, and $\beta p2$ the gain factor of the p-channel transistor M2.

While the trip voltage Vtr is defined as follows:

$$Vtr[Vi = Vm] = 1 + \frac{Vcc + K}{1 + \sqrt{\beta n3/\beta p2}}$$

Meanwhile, in the case where the supply voltage is 3.3V, the divided voltage Va is obtained as follows:

$$Va\ [Vcc = 3.3\ V] = \frac{Ry}{Rx + Ry} \times 3.3\ V < Vtn8$$

Therefore, the n-channel MOS transistor M8 is turned off, and the n-channel MOS transistor M10 is turned on because the high output voltage of the drain of the n-channel MOS transistor M8 is higher than the threshold voltage Vtn10 of the n-channel MOS transistor M10, with the result that the low output voltage (i.e. Vx="0=) of the drain of the n-channel MOS transistor M10 is applied to the gate of the p-channel MOS transistor M4 to turn on the p-channel MOS transistor M4. Therefore the value of the $\beta$ ratio of the first CMOS inverting means 10 is defined as follows:

$$\beta r(Vcc = 3.3\ V) = \frac{\beta n3}{\beta p2 + \beta p4}$$

where $\beta p4$ represents the gain factor of the p-channel transistor M4. Accordingly, the trip voltage vtr can be defined as follows:

$$Vtr[Vi = Vm] = 1 + \frac{Vcc + K}{1 + \sqrt{\beta n3/\beta p2 + \beta p4}}$$

As can be seen above, the denominator of the formula for the $\beta$ ratio of the first CMOS inverting means 10 becomes $\beta p2$ at the supply voltage of 5V, and $\beta p2 + \beta p3$ at the supply voltage of 3.3V. In other words, according as the supply voltage is low, the $\beta$ ratio $\beta r$ is reduced, while as the supply voltage high, the $\beta$ ratio enhanced relatively. Accordingly, the trip voltage of the inverter 10 can be maintained at a constant level irrespective of the variations of the supply voltage.

Thus, in the circuit according to the present invention, the applied supply voltage may be discriminated to automatically vary the $\beta$ ratio of the first inverter 10 so that the trip voltage of the inverter 10 is kept from being varied according to the supply voltage being varied.

Figure 6:
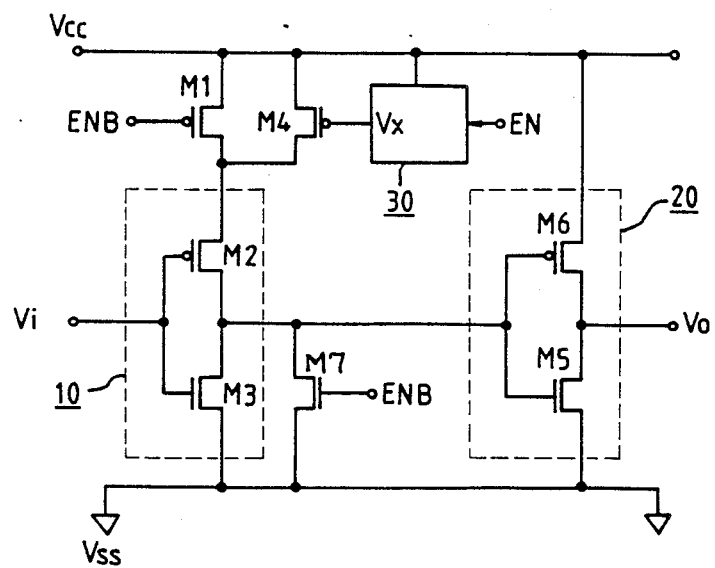
FIG. 6 illustrates a modified input translating circuit according the one embodiment present invention.

FIG. 6 illustrates another aspect of the present invention, which shows a modification of the constitution of the connections of the additional p-channel MOS transistor M4 for varying the $\beta$ ratio of the first CMOS inverting means 10 in accordance with the level of the supply voltage. In this modified embodiment, the additional p-channel MOS transistor M4 is connected parallel with the enabling, p-channel MOS transistor M1. Here, the geometrical size (W/L)$_2$ of the p-channel MOS transistor M2 provided within the first CMOS inverting means 10 is made sufficiently larger than the geometrical sizes (W/L)$_1$ and (W/L)$_4$ of the parallel connected p-channel MOS transistors M1 and M4.

Therefore, the drain-to-source current of the p-channel transistor M2 within the first CMOS inverting means 10 is based upon the sum of the drain-to-source current of the p-channel MOS transistor M1 and the drain-to-source current of the p-channel MOS transistor M4. Accordingly, when the p-channel MOS transistor M4 is turned on, the overall gain factor $\beta p$ of the coupled p-channel transistors M1 and M4 located at the upstream of the first CMOS inverting means 10 will become:

$$\beta p(ON) = \beta p1 + \beta p4 \ ; (Vcc=3.3V)$$

where $\beta p1$ and $\beta p4$ represent the gain factors of p-channel transistors M1 and M4 respectively. On the other hand, if the p-channel MOS transistor M4 is turned off, then the overall gain factor $\beta p$ will become:

$$\beta p(OFF) = \beta p1 \ ; (Vcc=5V)$$

As discussed hereinbefore, according to the present invention, the level of the supply voltage is read to automatically vary the $\beta$ ratio of the first CMOS inverting means, so that the trip voltage of said inverting means should be maintained at a constant level. Therefore, regardless of the variations of the level of the supply voltage, it is capable of translating the external input signal of the TTL level into the CMOS logic level properly, thereby minimizing the probability of error occurrence. Further, according to the present invention, the CMOS device can be manufactured without requiring a separate masking process for a customers' option, unlike the conventional technology, thereby making it possible to achieve simplification of the manufacturing process and reducing the manufacturing cost.

While there has been described the preferred embodiment of the invention, it will be understood that various modifications may be made therein, and it is intend to cover in the appended claims all such modifications as fall within the true spirit and scope of the invention.

What is claimed is:

1. An input translating circuit for a CMOS device comprising:
   a first p-channel MOS transistor (M1) for receiving inverted enable signals ENB at a gate thereof;
   a first CMOS inverting means (10) comprising a second p-channel MOS transistor (M2) having a source for receiving a supply voltage through said first p-channel MOS transistor M1, and a first n-channel MOS transistor (M3) having a grounded source, external input signals of a TTL level applied to a first connection node of the gates of said second p-channel and first n-channel MOS transistors (M2) and (M3), the connection node of drains of said transistors (M2) and (M3) serving as a first output terminal;
   a second CMOS inverting means (20) comprising a third p-channel MOS transistor (M6) having a source for receiving a supply voltage, and a second n-channel MOS transistor (M5) with a grounded source, said first output terminal of said first CMOS inverting means (10) connected to a second connection node comprising the gates of said third p-channel and said second n-channel MOS transistors (M6) and (M5); the connection node of drains of said transistors (M6) and (M5), serving as an second output terminal;
   a third grounded source n-channel MOS transistor M7 with inverted enable signals (ENB) applied to its gate, its drain connected to said second connection node of said second CMOS inverting means (20);
   a fourth p-channel MOS transistor (M4) having a drain and a source connected respectively to a drain and a source of said second p-channel MOS transistor (M2) of said first CMOS inverting means (10);
   a supply voltage level discrimination means (30) including a voltage dividing means (31) for producing a predetermined supply voltage, and a level comparing means (32) for comparing the predetermined voltage produced from said supply voltage level discrimination means (31) with the reference voltage to produce a control voltage (Vx) for said fourth p-channel MOS transistor (M4); said supply voltage level discrimination means (30) turning on or off said fourth p-channel MOS transistor (M4) in correspondence with the level of the supply voltage, wherein the geometrical aspect ratio $(W/L)_1$ of the first p-channel MOS transistor (M1) is made to be sufficiently larger than the geometrical aspect ratios $(W/L)_2$ and $(W/L)_4$ of said second and fourth p-channel MOS transistors (M2) and (M4) connected in parallel.

2. The input translating circuit for a CMOS device as claimed in claim 1, wherein the level comparing means (32) of said supply voltage level discriminating means (30) comprises:
   a first n-channel MOS transistor (M8) turned off when a divided voltage is below a threshold voltage Vtn8 and turned on if over said threshold voltage Vtn8;
   a first p-channel MOS transistor (M9) with a supply voltage applied to its source, the enable signals applied to its gate, and its drain connected to the drain of said first n-channel MOS transistor (M8);
   a second n-channel MOS transistor (M10) turned off when the output signal emitted from the drain of said first n-channel MOS transistor (M8) applied to the gate thereof is below a threshold voltage Vtn10, and turned on if over a threshold voltage Vtn10;
   a second p-channel MOS transistor (M11) in which the supply voltage is applied to its source, the enable signals are applied to its gate, and its drain is connected to the drain of said second n-channel MOS transistor (M10); and
   a third n-channel MOS transistor (M12) wherein enable signals are applied to its gate, its drain is commonly connected to the sources of said first and second n-channel MOS transistors (M8) and (M10), and its source is grounded, wherein the output of the drain of said second n-channel MOS transistor (M10) is applied to the gate of said fourth p-channel MOS transistor (M4) is connected in parallel to the second p-channel MOS transistor (M2) in said first CMOS inverting means (10).

3. The input translating circuit for a CMOS device a claimed in claim 2, further comprising: a constant voltage supply means (33) for applying a constant gate voltage under the enable condition to the gates of said first and second p-channel MOS transistors (M9) and (M11) in the level comparing means (32) of said supply voltage level discrimination means (30), so that the current through the drains of said first and second transistors (M9) and (M11) are maintained at a constant level regardless of the variations of the level of the enable signals; and said constant voltage supplying means (33) includes a fourth grounded source n-channel MOS transistor (M13) in which the enable signals are applied to its gate; a third p-channel MOS transistor (M14) in which the supply voltage is applied to its source, its drain is connected to the drain of the fourth n-channel MOS transistor (M13), and its gate is connected to its own drain, the connection node of the drains of said fourth n-channel and said third p-channel MOS transistors (M13) and (M14) is connected to the respective gates of the first and second p-channel MOS transistors (M9) and (M11) of the level comparing means (32).

4. An input translating circuit for a CMOS device comprising:

a first p-channel MOS transistor (M1) having a gate for receiving inverted enable signals;

a first CMOS inverting means (10) comprising a second p-channel MOS transistor (M2) having a source for receiving the supply voltage through said first p-channel MOS transistor (M1), and a grounded source first n-channel MOS transistor (M3), the external input signals of a TTL level applied to a first connection node comprising the gates of said second p-channel and first n-channel MOS transistors (M2) and (M3) and a second connection node formed of the drains of said transistors (M2) and (M3) serving as an first output terminal;

a second CMOS inverting means (20) comprising a third p-channel MOS transistor (M6) having a source for receiving the supply voltage, and a second grounded source n-channel MOS transistor (M5), said first output terminal of said first CMOS inverting means (10) being connected to a second connection node formed of the gates of said third p-channel and second n-channel MOS transistors (M6) and (M5); the connection node of drains of said transistors (M6) and (M5), and said connection node serving as a second output terminal;

a third grounded source n-channel MOS transistor (M7) in which inverted enable signals ENB are applied to its gate, its drain connected to said second connection node of said second CMOS inverting means (20);

a fourth p-channel MOS transistor (M4) in which its drain and source are respectively connected to the drain and source of said first p-channel MOS transistor (M1); and a supply voltage level discrimination means (30) including a voltage dividing means (31) for producing a predetermined voltage after division of the supply voltage and a level comparing means (32) for comparing the predetermined voltage produced from said supply voltage level discrimination means (31) with the reference voltage to produce a control voltage (Vx) for said fourth p-channel MOS transistor (M4), said supply voltage level discrimination means (30) turning on or off said fourth p-channel MOS transistor (M4) in correspondence with the level of the supply voltage, wherein the geometrical aspect ratio $(W/L)_2$ of the second p-channel MOS transistor (M2) of said first CMOS inverting means (10) is made sufficiently larger than the geometrical aspect ratios $(W/L)_1$ and $(W/L)_4$ of the first and fourth p-channel MOS transistors (M1) and (M4) connected in parallel.

5. The input translating circuit for a CMOS device as claimed in claim 4, wherein the level comparing means (32) within said supply voltage level discriminating means (30) comprises:

a first n-channel MOS transistor (M8) turned off if a divided voltage is below a threshold voltage Vtn8 thereof for said reference voltage, and turned on if over said threshold voltage Vtn8;

a first p-channel MOS transistor (M9) in which the supply voltage is applied to its source, said enable signals are applied to its gate, and its drain is connected to the drain of said first n-channel MOS transistor (M8);

a second n-channel MOS transistor (M10) turned off if an output signal level emitted from the drain of said first n-channel MOS transistor (M8) to be applied to the gate thereof is below a threshold voltage Vtn10, and turned on if said signal level is over the threshold voltage Vtn10;

a second p-channel MOS transistor (M11) in which a supply voltage is applied to its source, the enable signals are applied to its gate, and its drain is connected to the drain of said second n-channel MOS transistor (M10); and a third grounded source n-channel MOS transistor (M12) in which the enable signals are applied to its gate, its drain is commonly connected to the sources of said first and second n-channel MOS transistors (M8) and (M10), wherein the output of the drain of said second n-channel MOS transistor (M10) is applied to the gate of said fourth p-channel MOS transistor (M4).

6. The input translating circuit for a CMOS device as claimed in claim 5, wherein a constant voltage supply means (33) is further provided for applying a constant gate voltage under the enable condition to the gates of said first and second p-channel MOS transistors (M9) and (M11) in the level comparing means (32) of said supply voltage level discrimination means (30), so that the drains of said first and second transistors (M9) and (M11) are maintained at a constant level regardless of level variations of the enable signals; and said constant voltage supplying means (33) includes a fourth grounded source n-channel MOS transistor (M13) in which the enable signals are applied to its gate, and a third p-channel MOS transistor (M14) in which the supply voltage is applied to its source, its drain is connected to the drain of said n-channel MOS transistor (M13), and its gate is connected to its own drain, a third connection node comprising the drains of said fourth n-channel and third p-channel MOS transistors (M13) and (M14) is connected to the respective gates of the first and second p-channel MOS transistors (M9) and (M11) of the level comparing means (32).

* * * * *